United States Patent [19]

O'Loughlin

[11] Patent Number: 4,727,262
[45] Date of Patent: Feb. 23, 1988

[54] MULTICONCENTRIC COAXIAL CABLE PULSE FORMING DEVICE

[75] Inventor: James P. O'Loughlin, Albuquerque, N. Mex.

[73] Assignee: The United States of America as represented by the Secretary of the Air Force, Washington, D.C.

[21] Appl. No.: 896,042

[22] Filed: Aug. 13, 1986

[51] Int. Cl.$^4$ .............................................. H03K 3/00
[52] U.S. Cl. .................... 307/106; 307/108; 307/110
[58] Field of Search ........................ 307/106, 108, 110

[56] References Cited

U.S. PATENT DOCUMENTS

| | | | |
|---|---|---|---|
| 3,322,976 | 5/1967 | Blank | 307/110 |
| 3,463,992 | 6/1967 | Solberg | 320/1 |
| 3,845,322 | 10/1974 | Aslin | 307/108 |
| 4,005,314 | 1/1977 | Zinn | 307/110 |
| 4,484,085 | 11/1984 | Fallier, Jr. et al. | 307/106 |
| 4,536,723 | 8/1985 | Lang et al. | 307/106 |
| 4,549,091 | 11/1985 | Fahlen et al. | 307/106 |

FOREIGN PATENT DOCUMENTS 183821  9/1966  U.S.S.R. ............... 307/106

*Primary Examiner*—Bernard Roskoski
*Attorney, Agent, or Firm*—William G. Auton; Donald J. Singer

[57] ABSTRACT

A multiconcentric coaxial cable uses three or more concentric cables to supply power to a high voltage laser with reduced waveform degradation otherwise produced by stray capacitance and inductance. Each pair of concentric conductors is in itself a coaxial line and the radius of each conductor is selected such that the characteristic impedances of the two lines it forms with the adjacent conductors are equal. Each line is charged with a polarity opposite to the adjacent lines. Polarity inverting switches are connected across the lines charged to the polarity opposite to the desired output polarity at the end of the cable opposite from the load connection. The load is connected to the outermost cable conductor of the cable. When the switches are closed the polarity of the cable sections to which they are connected reverse and the sum of the voltages on all the cable sections is applied to the self-breaking gap causing it to close and connect the load. The sum of the impedances of the cable sections is designed to be equal to the load impedance and therefore the energy from the cable to the load is matched.

4 Claims, 6 Drawing Figures

MULTICONCENTRIC COAXIAL CABLE PULSE FORMING DEVICE

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to lasers requiring high voltages, and more specifically to pulse forming networks which are formed from coaxial cables. Coaxial cables have been used as pulse forming networks (PFN) since before 1940, and were the basis for the derivation of the canonical lumped parameter networks during WW II. The pulse fidelity from cables is unequaled but there are some limitations and disadvantages inherent with their use. The most significant limitation is the length of cable required, typically about 90 meters per microsecond. Another limitation is the practical range of characteristic impedance being about 10 to 100 ohms, but this at least is within the range of many PFN applications. Both of these limitations are somewhat overcome by the lumped parameter PFN, usually with an acceptable degradation in pulse fidelity. However, when scaling to very high voltage and energy, problems arise with the lumped parameter PFN which begin to put them at a disadvantage with respect to coaxial lines. Specifically, stray inductance and capacitance of the lumped parameter PFN causes serious degradation of pulse fidelity. A coaxial cable is a distributed parameter device and the stray problems with scaling does not exist. Another disadvantage with conventional cable PFN systems is the size and volume required. When lumped parameter devices such as conventional PFN's, Blumlein's Marx generators, etc., are scaled up, they require large oil filled tanks which are also very costly. The actual cables themselves are self contained regardless of the size, and can be orders of magnitude smaller in the overall space required and the total cost.

The task of providing a pulse forming device using coaxial cable technology without high space requirements, and without waveform degradation due to stray capacitance and inductance is alleviated, to some degree, by the following U.S. Patents, the disclosures of which are incorporated by reference:

U.S. Pat. No. 3,463,992 issued to Solberg;
U.S. Pat. No. 3,845,322 issued to Aslin;
U.S. Pat. No. 4,005,314 issued to Zinn;
U.S. Pat. No. 4,484,085 issued to Fallier, Jr. et al; and
U.S. Pat. No. 4,549,091 issued to Fahlen et al.

Zinn discloses a device for achieving a narrow high voltage output pulse having a rise time essentially limited only by the rise time of the switching means. It comprises a voltage source connected through a semiconductor switch to an energy storage device. This device uses a plurality of capacitors fabricated similarly to a conventional coaxial cable, but includes a plurality of conductive elements with insulating means disposed between each element. Holdoff semiconductor diodes are connected to the coaxial elements and a load is connected between the outer element and ground. The capacitors of the reference are charged in parallel from the single power source and discharged in series through a second current path which includes the common load.

Soldberg discloses a capacitive storage system which employs capacitors having different time constants and charged with a voltage magnitude and polarity different for each capacitor. This patent discloses two capacitors in series charged separately to unequal voltages of opposite polarity for long term energy storage.

Aslin shows a Marx type pulse generator. Fahlen et al discuss a pulsed electrical power circuit for high repetition rate gas lasers. In Fallier, Jr. et al a pulse generator is formed by overlapping conductive spiral strips separated by insulating strips.

Pulse forming networks composed of coaxial cables which use two conductors provide comparatively low energy storage utilization, have high cost and space requirements and produce waveform degradation due to stray capacitance and inductance. There remains a need in the art to provide a pulse forming device which reduces these problems. The present invention is intended to satisfy that need.

SUMMARY OF THE INVENTION

The present invention provides a pulse forming device for lasers which require high voltage using a multiconcentric coaxial cable, and a plurality of polarity inverting switches. The multiconcentric coaxial cable uses three or more concentric waveforms to obtain pulse waveforms as described below.

Note that each pair of concentric conductors, in the multiconcentric cable, act as a coaxial line. The radius of each conductor is selected to match its impedance with adjacent conductors.

Each conductor is charged with a polarity which is opposite that of adjacent conductors. The polarity inverting switches are connected across the conductors, and charged to the polarity which is opposite to the desired polarity at the end of the cable opposite from the load.

The load is connected to the outermost cable conductor, and through a self-breaking gap to the centermost conductor. When the switches are closed the polarity of the cable sections to which they are connected reverse and the sum of the voltage on all the cable sections is applied to the self-breaking gap causing it to close and connect the load. The sum of the impedances of the cable sections is designed to be equal to the load impedance and therefore the energy transfer from the cable to the load is matched.

It is an object of the present invention to provide a pulse forming device that solves the problem of low energy storage utilization which usually is inherent in two conductor cable systems.

It is another object of the present invention to provide a pulse forming device that reduces laser waveform degradation caused by stray capacitance and inductance.

It is another object of the present invention to reduce the cost and space requirements of high voltage pulse generators.

These objects together with other objects, features and advantages of the invention will become more readily apparent from the following detailed description when taken in conjunction with the accompanying drawings wherein like elements are given like reference numerals throughout.

DETAILED DESCRIPTION OF THE PREFERRED EMBODIMENT

The present invention is a multiconcentric coaxial cable pulse forming device.

Figure 1:
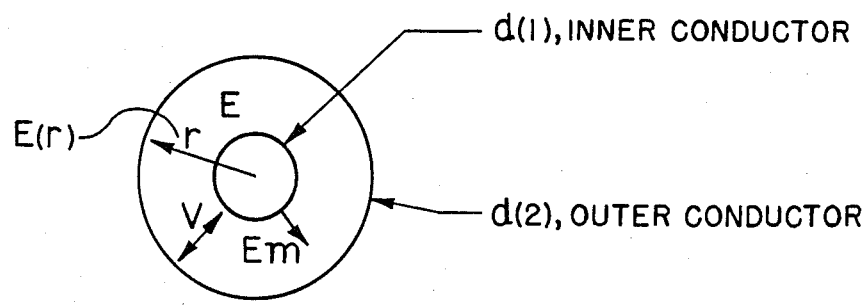
FIG. 1 is a schematic of an end view of a coaxial cable.

The reader's attention is now directed towards FIG. 1 which is a schematic of an end view of a coaxial cable. Some of the major items involved with cable technology are the design of the termination and the utilization of dielectric material in capacitors vs. cables. The energy storage per unit volume (specific energy) in a conventional capacitor is uniform and much higher than that in a coaxial cable. This is due to the fact that the maximum allowed electric field (E) in a cable dielectric is limited to the area adjacent to the inner conductor and falls off inversely with the radius. Since the specific energy is proportional to the square of E the utilization of the total dielectric in a cable is poor. In a capacitor all the dielectric is stressed at the maximum E and the utilization is optimum.

The relevant equations for a coaxial cable, as depicted in FIG. 1, are:

$$Zo = 60 * LOGe^{[d2/d1]} / \sqrt{\epsilon} \tag{1}$$

$$Em = 2*V/(d1*LOGe^{(d2/d1)}) \tag{2}$$

$$E(r) = Em*d1/(2*r) \tag{3}$$

where:
Zo = characteristic impedance;
Em = maximum electric field (at the inner conductor surface);
$\epsilon$ = relative permitivity of the dielectric;
d1 = inner diameter;
d2 = outer diameter;
E(r) = electric field at radius r; and
V = the voltage between the conductors at d1 and d2.

Figure 2:
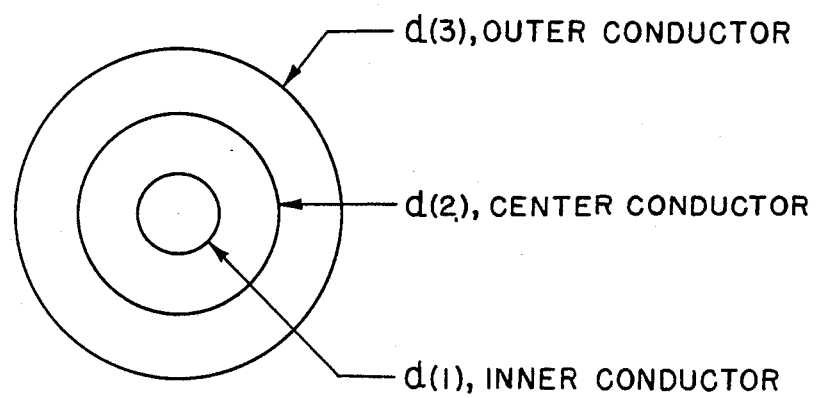
FIG. 2 is a schematic of an end view of a multiconcentric coaxial cable which is used in the present invention.

FIG. 2 is a schematic of an end view of the multiconcentric cable used in the pulse forming device of the present invention. A multiconcentric coaxial cable simply has more than two concentric conductors as shown in FIG. 2. The equations (1), (2) and (3) can be applied to the system of FIG. 2, with the appropriate bookkeeping. The numbering will always be taken from the inner conductor outward. That is, as Equation 1 presented a single impedance Zo for a coaxial cable, the equations for the impedance of a triaxial cable are as in equations presented below:

$$Zo(1) = \frac{60}{\sqrt{\epsilon}} \ln \frac{d(2)}{d(1)} \tag{4}$$

$$Zo(2) = \frac{60}{\sqrt{\epsilon}} \ln \frac{d(3)}{d(2)} \tag{5}$$

where $\epsilon$ equals the dielectric permitivity.

Figure 3:
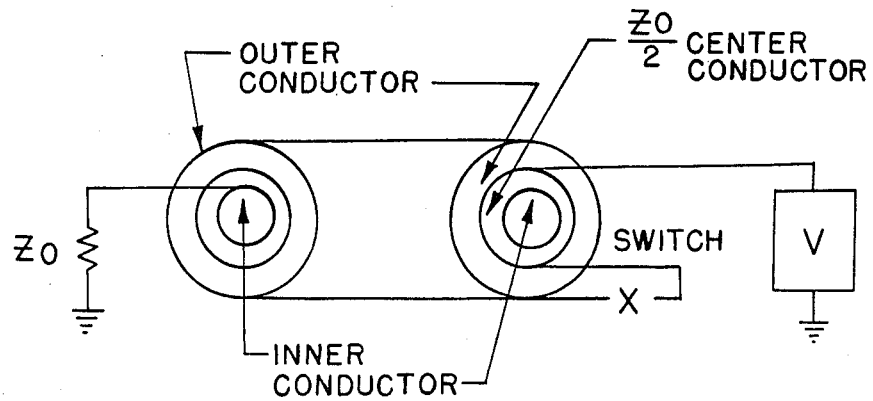
FIG. 3 is a schematic of a Blumlein circuit using a triaxial cable of FIG. 2.

FIG. 3 is a schematic of a Blumlein circuit using the triaxial cable of FIG. 2. The inner and outer sections have the same characteristic impedance and are charged to opposite and equal voltage. The load Zo is connected between the inner conductor and a shorting switch (x) is connected across one of the sections at the opposite end of the line. When the switch x closes the voltage reverses and the two sections of line discharge into the load. In FIG. 3, an arrangement analogous to a Marx generator/Blumlein combination is applied to a multiconcentric cable. The advantage is that the full voltage is only obtained at the time of discharge, and the energy is stored at a voltage reduced in corresponding to the number of concentric sections.

Analysis of the energy utilization shows that in FIG. 3, there is no improvement over the case of the same cable (i.e., the same o.d. and i.d.) configured as a simple two conductor coax and charged to the same total erected voltage. In fact, the utilization is slightly degraded in the multiconcentric due to the additional thickness of the extra conductors.

Figure 4:
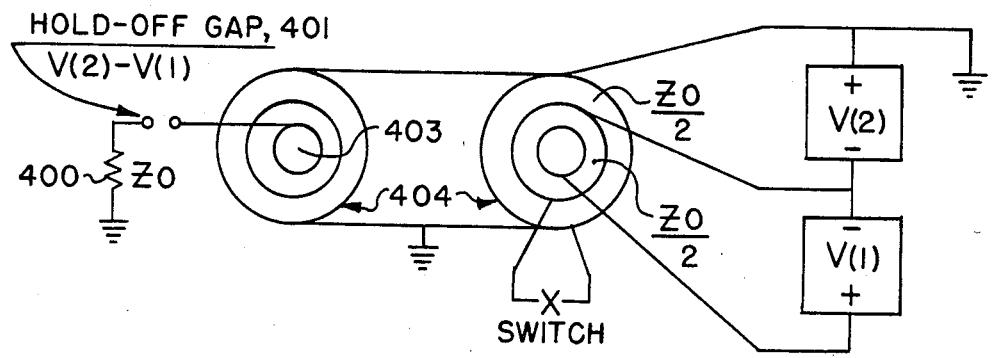
FIG. 4 is a schematic of the multiconcentric coaxial cable pulse forming network of the present invention.

Now consider the same multiconcentric cable with equal characteristic impedances but with a different charging voltage applied to each section so that the field gradient E at the surface of the inner conductor of each section is at the maximum rated value. Now the outer sections will be charged to higher voltages because of the larger radii and the utilization of the dielectric is improved. There is no problem with the voltage division when the switches erect because all the sections are the same impedance even though they are charged to different voltages. There is one problem in that the sum of the voltages no longer equals zero, so the inner conductor cannot be connected to the load during the charging period. This is easily fixed by adding a self-breaking gap as shown in FIG. 4. The magnitude of this voltage "unbalance" is held to a minimum if an even number (N) of sections are used.

FIG. 4 is a schematic of the multiconcentric coaxial cable pulse forming device of the present invention. This pulse forming device supports a load 400 of impedance Zo. This load 400 is electrically connected by a hold-off gap 401 to the center conductor 403 of the multiconcentric coaxial cable, and to a common electrical ground shared by the outermost conductor 404 of the cable. The multiconcentric coaxial cable thereby supples high voltage to the load from two voltage sources V(1) and V(2) in accordance with the equations below:

$$V(1) = \frac{Em}{2} d(1) \ln \frac{d2}{d1} \tag{6}$$

$$V(2) = \frac{Em}{2} d(2) \ln \frac{d3}{d2} \tag{7}$$

Note that the present invention is not limited to the triaxial system of FIG. 4.

Consider an N section Multiconcentric cable which is to have a matched erected impedance of Zo with each section operating at the maximum stress Em. Then for each section:

$$Zo/N = 60 * LOGe^{(d(n+1)/d(n))} \sqrt{\epsilon} \quad (8)$$

and this fixes $$LOGe^{(d(n+1)/d(n))} = \sqrt{\epsilon} * Zo/(N*60) \quad (9)$$

and $$A = d(n+1)/d(n) = EXP(\sqrt{\epsilon} * Zo/(N*60)) \quad (10)$$

for all n, The outer diameters are related to the inner diameter d(1) as:

$$d(n) = d(1)*A1n = d(1)e^{\frac{nZo\sqrt{\epsilon}}{N60}} \quad (11)$$

The voltage between the n and n+1 conductor is designated as V(n) and is given by:

$$V(n) = d(1)*EXP(n-1)* \sqrt{\epsilon} *Zo)*Em*\sqrt{\epsilon} *Zo/(120*N) \quad (12)$$

The term $\sqrt{\epsilon} *Zo$ occurs frequently and is defined as;

$$Q = \sqrt{\epsilon} *Zo \quad (13)$$

Using (12) and (13) the total erected voltage Vp can be expressed as:

$$Vp = \frac{d(1)Em\ Zo\sqrt{\epsilon}}{120N} \sum_{n=1}^{N} e^{\frac{(n-1)Zo\sqrt{\epsilon}}{60N}} \quad (14)$$

or $$d(1) = \frac{120N\ Vp}{Em\ Zo\sqrt{\epsilon} \sum_{n=1}^{N} e^{\frac{(n-1)Zo\sqrt{\epsilon}}{60N}}} \quad (15)$$

and the total outside diameter d(N) is given by:

$$d(N) = d(1)*A^N = d(1)e^{\frac{Zo\sqrt{\epsilon}}{60}} \quad (16)$$

The dielectric utilization for energy storage can be calculated by integrating the energy storage over the multiconcentric cable and dividing by the energy that would be stored if the dielectric were under constant maximum stress. The energy storage rating factor J% is given as:

$$J\% = Q((30*N)*(EXP(Q/(30*N))-1) \quad (17)$$

The voltage grading ratio's required to maintain the peak stress on the inner diameter of each of the N sections of a multiconcentric is given by:

$$V(N,j) = \frac{e^{\frac{(j-1)Zo\sqrt{\epsilon}}{60N}}}{\sum_{n=1}^{N} e^{\frac{(n-1)Zo\sqrt{\epsilon}}{60N}}} \quad (18)$$

Where V(N,j) is the voltage between the j and j+1 conductors of an N section cable.

The residual voltage, i.e., the voltage which the load isolation gap must hold off, is held to a minimum by using an even number (N) of sections and is calculated by summing equation (18) with alternate signs for each term. The outside diameter of a cable can be evaluated as a function of Q and N by writing equation (14) as;

$$d(N)*Em/Vp = \frac{120N\ Vp}{Em\ Zo\sqrt{\epsilon} \sum_{n=1}^{N} e^{\frac{nZo\sqrt{\epsilon}}{60N}}} \quad (19)$$

Equation (19) shows that there is clearly an optimum Q for a minimum diameter and that the diameter does decrease for increasing N.

Much more impressive is the comparison of energy stored per unit volume of cable. The volume is taken to be a full cylinder of the outside diameter. The expression giving the specific energy Js is;

$$Js/(Em*Em*Eta) = \frac{Zo\sqrt{\epsilon} \left[ \sum_{n=1}^{N} e^{\frac{(n-1)Zo\sqrt{\epsilon}}{60N}} \right]^2}{7200\pi C\ N^2 e^{\frac{Zo\sqrt{\epsilon}}{30}}} \quad (20)$$

Where:
c = 3E8 meters/sec (speed of light)
Js = energy density joules/cubic meter
Em = maximum gradient volts/meter Equation (20) shows a very significant improvement in specific energy for increasing N as well as optimum values as a function of Q.

The difference in specific energy at optimum Q, between a single conventional cable and a two section (triaxial) is about six times in favor of the triaxial. A four section is about 25 times better and a six section 60 times better in terms of energy stored per unit volume of cable. These improvements are translated to reductions in volume, weight and cost when they are applied to the same load.

Figure 5:
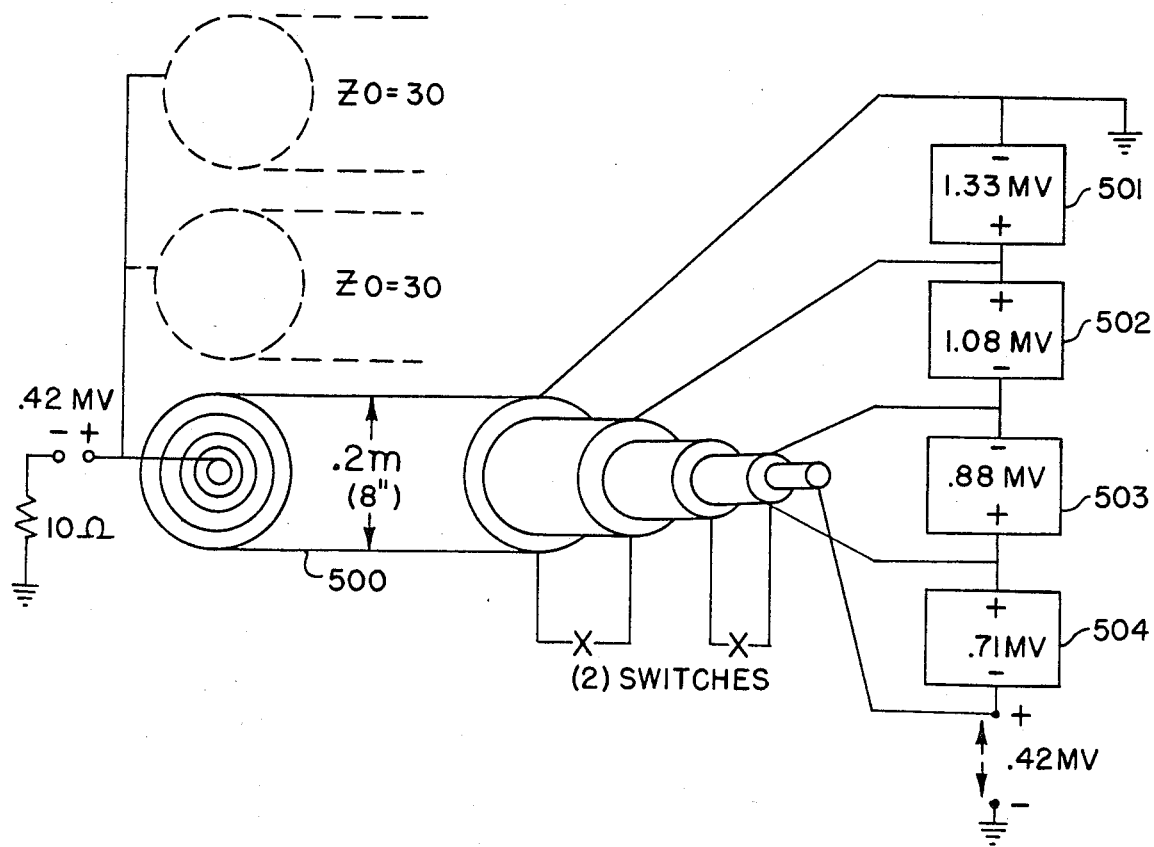
FIG. 5 is a schematic of an embodiment of the present invention.

FIG. 5 is a specific embodiment of the present invention which uses a multiconcentric cable 500 to supply a load of 10 ohms with power from four voltage supplies 501-504 according to the design principles described above. The system of FIG. 5 is required to drive a 10 ohm load with a 2.5 microsecond pulse at 2 MV. The peak erected voltage Vp is 4 MV for a matched output of 2 MV. The design of FIG. 5 uses conservative values of 2000 volts/mil (78.74 MV/meter) and an $\epsilon$ of 2.7. The optimum Q with N=4 is 50, which gives a Zo of 30 ohms. So three parallel cables will be used to drive the 10 ohm load. With N=4, the diameter of the cable is found to be 0.2023 meters or 8 inches. The voltages of the four sections are found to be 0.178, 0.129, 0.270, and 0.333 normalized to the peak charge voltage of 4 MV. The length of the cable for a 2.5 microsecond pulse and ε of 2.7 is 228 meters (749 feet). The volume of the three cables is 22 cubic meters or 776 cubic feet and would weigh about 43,738 Kg (96,225 lbs.). The stored energy is 1 MJ or about 10 joules per pound which is less than the specific energy of conventional capacitors, but that is not the whole story. Using a lumped parameter store of capacitors requires a huge tank of oil which adds up to much more total weight and volume than the cable. In addition, the cable waveform, in the system of FIG. 5, is not deteriorated by the stray inductance and the cable is nowhere near as mechanically awkward. The cable is only eight inches in diameter and plugs into the load with only a hold-off gap. The cable is so small that the space near the load is not cramped. The switch assembly is at the far end of the cable and can be located in a convenient place. The cable is flexible and can be coiled or laid in a trench or overhead rack. Furthermore, if a stress of 3000 volts/mil is used the size drops to only 5.4 inches diameter and the volume and weight become 9.8 cubic meters (345 cubic feet) and 19,440 Kg (42,767 lbs.).

Figure 6:
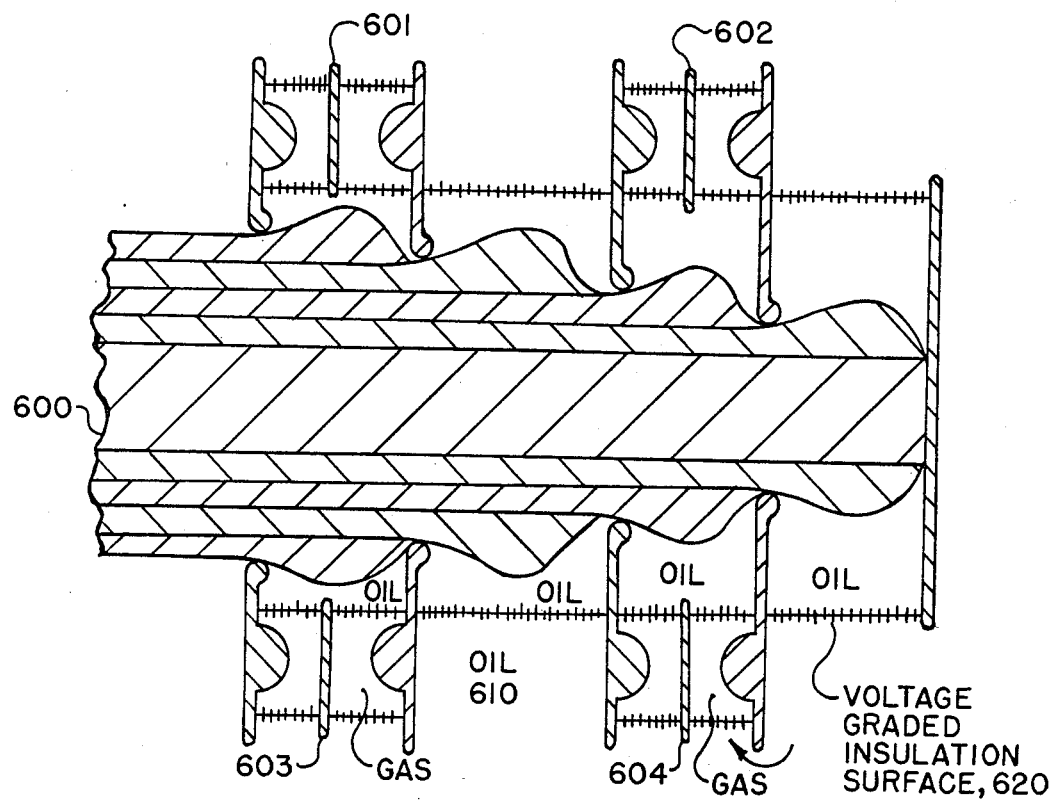
FIG. 6 is an illustration of the design of switch attachment to multiconcentric coaxial cables used in the present invention.

The design and method of attaching the switches to multiconcentric cables is an important consideration. A conceptual design using concentric gap switches is shown in FIG. 6. As depicted in FIG. 6, the four conductor multiconcentric cable 600 is equipped with four concentric mid-plane gas switches 601–604 which each bridge adjacent conductors through voltage graded insulation surfaces in the cable. As described above, this system reduces the cost and space requirements of high voltage pulse generators and solves the problem of waveform degradation due to stray capacitance and inductance.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. A pulse forming network which receives charging voltages from a plurality of voltage sources and supplies an output voltage to a load, said pulse forming network comprising:
    a multiconcentric coaxial cable having a plurality of concentric conductors including an innermost conductor and an outermost conductor, each of said plurality of concentric conductors being adjacent to at least one other concentric conductor, thereby forming adjacent conductor pairs which serve as coaxial lines, said adjacent conductor pairs each being electrically connected to one of a plurality of voltage sources to receive a charging voltages, and said innermost conductor outputting an output voltage;
    a self-breaking gap which is electrically connected between said innermost conductor and said load to conduct said output voltage to said load when said load is connected to a common electrical ground with said outermost conductor; and
    a plurality of polarity inverting switches which are each electrically connected between one of said adjacent conductor pairs, each of said polarity inverting switches being charged with a polarity opposite to a desired output polarity at an end of said multiconcentric coaxial cable which is opposite from the load, said polarity inverting switches closing to reverse all polarities in said concentric conductors and thereby driving said self-breaking gap to close and supply said output voltage to said load.

2. A pulse forming network, as defined in claim 1, wherein each of said plurality of concentric conductors has a radius which is selected to match its impedance with adjacent conductor pairs.

3. A pulse forming network, as defined in claim 2, wherein said multconcentric coaxial cable has an effective characteristic impedance which equals that of said load so that said output voltage results in a matched energy transfer to said load when said self-breaking gap is closed.

4. A pulse forming network, as defined in claim 3, wherein said charging voltages, from said plurality of voltage sources, are each selected to produce an equal field intensity in its respective concentric conductor, said field intensity having a square which is proportional to the average energy density for said multiconcentric coaxial cable, said field intensity having a square which is proportional to the average energy density for said multiconcentric coaxial cable, said field intensity, therefore, being a uniform high average field intensity which maximizes the total stored energy in said multiconcentric coaxial cable and reduces waveform degradation in said waveforms delivered to said load of said high voltage laser.

* * * * *